United States Patent [19]

Gmitter et al.

[11] Patent Number: 4,846,931

[45] Date of Patent: Jul. 11, 1989

[54] METHOD FOR LIFTING-OFF EPITAXIAL FILMS

[75] Inventors: Thomas J. Gmitter, Lakewood; Eli Yablonovitch, Middletown, both of N.J.

[73] Assignee: Bell Communications Research, Inc., Livingston, N.J.

[21] Appl. No.: 174,852

[22] Filed: Mar. 29, 1988

[51] Int. Cl.$^4$ .................. H01L 21/306; B44C 1/22; C03C 15/00; C03C 25/06

[52] U.S. Cl. ............................. 156/633; 156/655; 156/662; 350/96.12

[58] Field of Search ............ 156/631, 629, 630, 635, 156/655, 662, 668; 437/2, 228, 234; 350/96.12, 96.2, 96.29, 96.3

[56] References Cited

PUBLICATIONS

M. Konagai et al., "High Efficiency GaAs Thin Film Solar Cells by Peeled Film Technology," *Journal of Crystal Growth*, 45, pp. 277–280 (1978).

K. Y. Lee et al., "Fabrication of Ultrasmall Devices on Thin Active GaAs Membrane," *J. Vac. Sci. Technol.* B5(1), 322–325, Jan./Feb. (1987).

J. C. C. Fan, "Thin Films of III-V Compounds and Their Applications," *Journal de Physique*, 43, Ci-327 (1982).

D. L. Miller et al., "GaAs Peeled Film Solar Cells," Document #MRDC41056.49 FRD, Final Report Draft for the period 3/15/80–12/31/81 prepared for Solar Energy Research Institute under subcontract No. X5-0-9002-2.

Yablonovitch et al., "Extreme Selectrivity in the Lift-Off of Epitaxial GaAs Films" *Appl. Phys. Letters*, 51(26) 2222–2224 (Dec. 28, 1987).

*Primary Examiner*—William A. Powell
*Attorney, Agent, or Firm*—James W. Falk; Charles S. Guenzer

[57] ABSTRACT

A method for removing epitaxial films from a single crystal substrate upon which it is grown comprising (a) providing a thin release layer ($\leq 1000A$) between the film to be grown and the substrate; (b) growing the epitaxial film(s); (c) applying a polymeric support layer which is under tension over the film; and (d) selectively etching the release layer, the tension in the support layer causing the edges of the film to curve upwardly as the release layer is etched away.

17 Claims, 2 Drawing Sheets

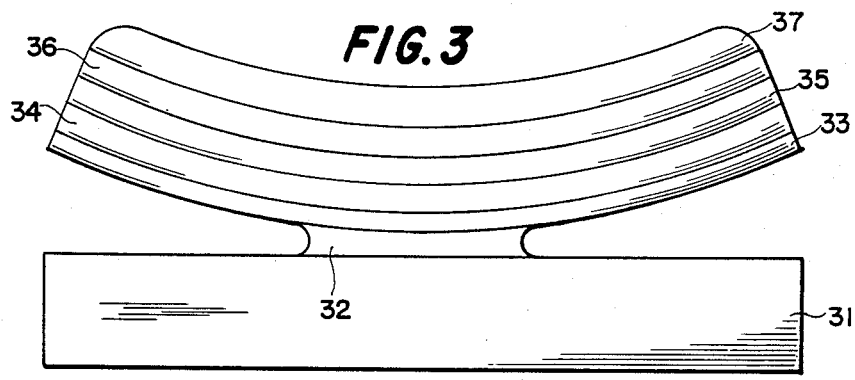
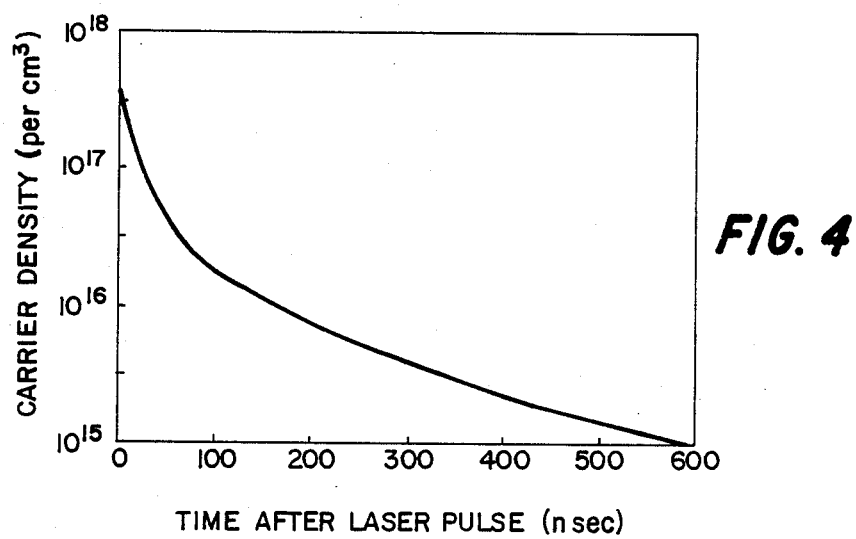
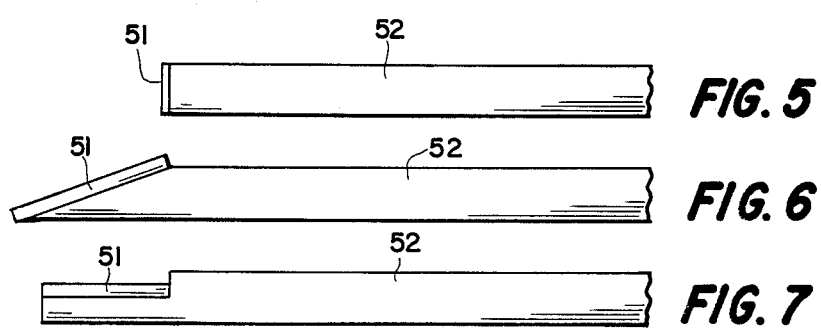

METHOD FOR LIFTING-OFF EPITAXIAL FILMS

BACKGROUND OF THE INVENTION

1. Field of the Invention

This invention relates to epitaxially grown films and devices and more particularly to a method of releasing such films and/or devices from the single crystal substrate upon which it is formed to enable its transfer to other substrates and reuse of the single crystal substrate.

2. Description of the Prior Art

In thin film technology there has always been a tradeoff between the material quality of the film and the ease of depositing that thin film. Epitaxial films represent the highest level of quality, but they must be grown on and are accompanied by cumbersome, expensive, bulk single crystal wafer substrates. For some time, research has focused on the possibility of creating epitaxial quality thin films on arbitrary substrates while maintaining the ultimate in crystalline perfection.

The main approach has been to attempt to reuse the substrate wafer by separating it from the epitaxially grown film; however, to undercut a very thin film over its entire area without adversely affecting the film or the underlying substrate, the selectivity must be extremely high. This is very difficult to achieve. For example, J. C. Fan has described a process in which an epitaxial film is cleaved away from the substrate on which it is grown. Such change, at best, is difficult to achieve without damage to the film and/or substrate, or without removal of part of the substrate. Also, in some instances, the cleavage plane (<110>) and the growth plane (<100>) of the film may be mutually exclusive.

In a paper by Konagai et al appearing in J. of Crystal Growth 45, 277–280 (1978) it was shown that a Zn doped p-$Ga_{1-x}Al_xAs$ layer can be selectively etched from GaAs with HF. This observation was employed in the production of thin film solar cells by the following techniques. In one technique, zinc doped p-$Ga_{1-x}Al_xAs$ was grown by liquid phase epitaxy (LPE) on a n-GaAs grown layer on a GaAs single crystal substrate. During this LPE growth of the Zn doped $Ga_{1-x}Al_xAs_x$, Zn diffuses into the surface of the underlying GaAs to form a p-type GaAs layer and hence p-n GaAs junction. The surface p-$Ga_{1-x}Al_xAs$ is then selectively etched away leaving the p-n junction GaAs layers on the GaAs substrate.

In another solar cell fabrication process Konagai et al describe a "peeled film technology". Here, a 5 micron thick $Ga_{0.3}Al_{0.7}As$ film is epitaxially grown on a GaAs <111> substrate by LPE. A 30 micron thick Sn doped n-GaAs layer is then grown over the $Ga_{0.3}Al_{0.7}As$ layer and a p-n junction is formed by diffusing Zn into the specimen utilizing $ZnAs_2$ as the source of Zn. Appropriate electrical contacts are then formed on the films using known photoresist, etch and plating techniques. The surface layer is then covered with a black wax film supper layer and the wafer is soaked in an aqueous HF etchant solution. The etchants selectively dissolves the the $Ga_{0.3}Al_{0.7}As$ layer which lies between the thin solar cell p-n junction device layers and the underlying substrate, allowing the solar cell attached to the wax to be peeled off the GaAs substrate for placement on an aluminum substrate. The wax provides support for the peeled film.

While the technique described above has been described in the literature for ten years, it was not adopted by the industry. One reason for this was a difficulty encountered in completely undercutting the $Ga_{0.3}Al_{0.7}As$ 'release' layer in a reasonable time, especially when the area of the film to be peeled was large. This difficulty arose due to the formation and entrapment of gas, formed as a reaction product of the etching process, within the etched channel. The gas created a bubble in the channel preventing or diminishing further etching and causing cracking in the epitaxial film. The problem could only be partially obviated by using very slow reaction rates (very dilute HF solutions). Since the time required for peel-off, as well as ensuring no or minimal charge to the overlying film is important, the process was virtually abandoned.

A means for providing for the needed circulation of etchant and reaction products and the release of any gaseous reaction products of the etching process while maintaining high selectivity is therefore desired.

SUMMARY OF THE INVENTION

The present invention is directed to a process for selectively peeling an epitaxial film from a single crystal substrate upon which it was grown and to device configurations employing such peeled films.

The novel method comprises selectively etching away a thin release layer positioned between an epitaxial film and the substrate upon which it grown, while causing edges of the epitaxial film to curl upward as the release layer is etched away, thereby providing means for the escape and outdiffusion of the reaction products of the etching process from the area between the film and the substrate.

The present invention is further directed to novel structures employing such peeled film.

BRIEF DESCRIPTION OF THE DRAWINGS

FIG. 3 is a side elevational view depicting a double heterostructure test device for measuring parameters of the films obtained from the novel lift-off process.

FIG. 4 shows the minority-carrier lifetime decay curve of the double heterostructure device of FIG. 3, both before and after lift-off, plotting carrier density (carriers/$cm^3$) vs. time (sec.) after application of an excitation pulse.

FIGS. 5–7 show various structures of a peeled semiconductor film adhered to a glass fiber in a manner so as to provide a coupled semiconductor device-fiber structure.

DETAILED DESCRIPTION OF THE INVENTION

The present invention is based upon the discovery of a unique means for lifting-off an epitaxial film from the substrate upon which it is grown so as to substantially eliminate the problem encountered in the past due to entrapment of gaseous reaction products in the channel formed during etching of a release layer between the film and the substrate.

In general terms, the present invention differs from the teachings of Konagai et al by providing means for lifting the edges of the epitaxial film as the release layer is selectively etched away, thereby creating a concave film surface. In this way, gaseous products of the etching reaction, which otherwise tend to accumulate in the etched channel preventing further etching and causing cracking of the epitaxial film, can now escape from the channel. The means provided for lifting the edges of the epitaxial film is a support layer over the film which is applied to the film under tension causing the film to be under compression thereby creating a concave curvature in the film as the release layer is etched away.

Figure 1:
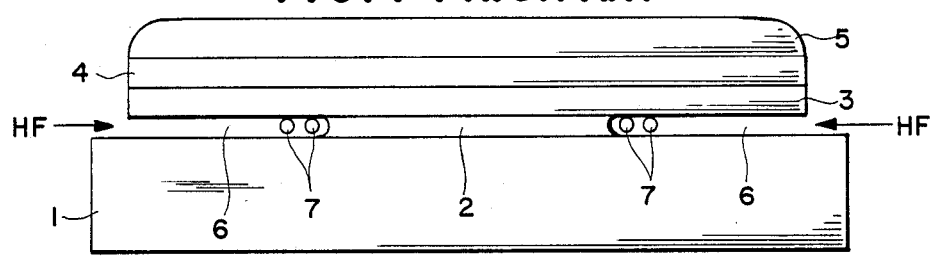
FIG. 1 is a side elevational view showing an epitaxially grown thin film semiconductor device being peeled from an underlying single crystal substrate by the prior art etching technique.
Figure 2:
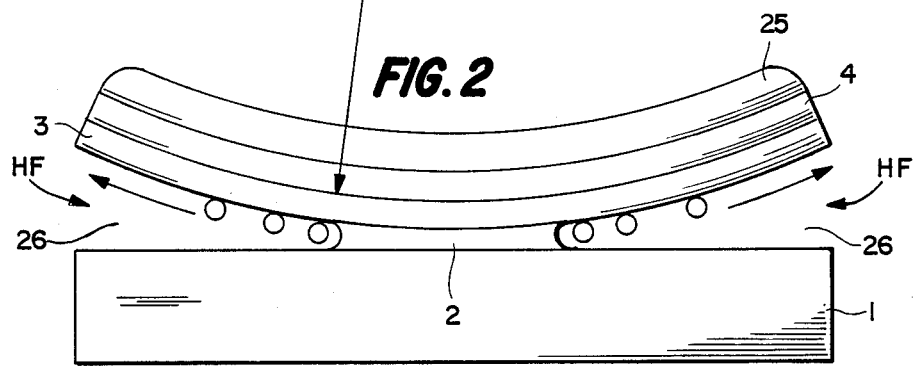
FIG. 2 is a side elevational view showing an epitaxially grown thin film semiconductor device being peeled from an underlying single crystal substrate by the etching technique of the present invention.

The principal of the invention can best be understood with reference to FIGS. 1 and 2. FIG. 1, which illustrates the prior art etch technique, shows a single crystal GaAs substrate 1 having a thin release film 2 on the surface thereof and epitaxially grown p-type and n-type GaAs layers 3 and 4, forming a p-n junction device, thereon. A support layer 5 (described as a black wax in the prior art), overlies the epitaxial layers 3 and 4. Here, as hydroflouric acid etches the release film 2 a uniformly thick channel 6 forms between the epi-layer 3 and the substrate 1. As etching progresses, the gas reaction product, which has the lowest solubility of any of the reactants or reaction products, is difficult to diffuse away thereby limiting the undercutting speed and the permissible HF acid concentration. If the solubility limits are exceeded, bubbles 7 form at the reaction zone in the channel 6 displacing the etchant and producing a gas pressure which cracks the epitaxial film. Hence, permissible acid concentrations and therefore etch speeds are very low.

In comparison, FIG. 2 shows the results of the novel technique employing the same structure, but where a support layer 25 is applied so as to be under tension such that as undercutting of the release layer 2 occurs, the film curls with a radius of curvature R thereby forming a non-uniform channel 26 which is wider at the edges than the center of the film.

We have calculated the maximum permissible speed of undercutting for the case of the prior art plane parallel etching 6. Equating the diffusion flux with the etching flux:

$$vt3N = -Dt \frac{dn}{dz} \quad (1)$$

where v is the etching speed, n and N are the molar concentrations of dissolved gas and release layer (e.g. AlAs) respectively, t is the thickness of the channel, D is the diffusion constant of the gas, and z is the position coordinate down the channel. It is assumed that 3 moles of gas are produced for every mole of AlAs. By making this calculation, we see that thickness cancels from both sides of the equation, hence, contrary to intuition, a thick release layer which leads to a wider channel does not overcome the mass transport problem since proportionately more gas must be removed. Integrating equation (1) down a plane parallel channel of depth L results in a maximum undercutting speed v:

$$v = Dn/3LN \quad (2)$$

where n is now the saturation solubility of the gas. For an AlAs or a $Al_xGa_{1-x}As$ release layer where x is from 0.5 to 1, n/N is approximately $2 \times 10^{-5}$ and D in aqueous media is about $5 \times 10^{-5}$ cm$^2$/sec. Hence, the speed of removal of the release layer is severely limited in channels of any significant depth. However, if the channel opens up by virtue of the curvature shown in FIG. 2, then the outdiffusion becomes much easier.

Equating again, the etching flux with the diffusion flux for the novel method as depicted with reference to FIG. 2:

$$vt3N = -D\left(t + \frac{z^2}{2R}\right)\frac{dn}{dz} \quad (3)$$

where R is the radius of curvature induced by the tension in the support layer. Integrating this equation we get $$v = \frac{1}{3\pi \sqrt{Rt/2}} \frac{Dn}{N} \quad (4)$$

Comparing equations (2) and (4) it can be seen that the effective depth "L" of the channel is fixed at a small value $\pi\sqrt{Rt/2}$ roughly the geometric mean of R and t and independent of the actual depth. Since t is a microscopic quantity representing the thickness of the release layer, and the radius of curvature, R, is typically a few centimeters, L can be as little as 30 microns even when the actual channel depth is one hundred times deeper. Hence, we have found that contrary to intuition, using the novel method, the need to transport reaction product away from the etching zone (the interface) of acid and release layer) one should make the release layer as thin as possible. Typically, we have employed release layers of less than 1000 A in thickness and some as thin as 20 A.

After etching is complete, the epitaxial layers remain supported by the support layer and may be transferred to another substrate leaving the expensive single crystal original substrate available for re-use.

The films may be adhered to the new substrate, e.g. glass, diamond, silica, quartz, metal, etc. by bonding the film e.g. with an ultraviolet curable cement of the type used to splice optical fibers and as is known in that art of with other compatible adhesives. In this way, a permanent support for large area crack free, peeled films can be made.

Alternatively, we have discovered that GaAs epitaxial films, for example, can be directly "optical contacted" to certain substrates, e.g. glass or silicon due to strong Van Der Waals forces bonding the surfaces of the film to the substrate without the need for adhesives. The support layer can be washed away with an appropriate solvent.

In order to determine the material quality and the etching characteristics, measurements of contactless minority-carrier lifetime decay was taken employing a double heterostructure as shown in FIG. 3. In accordance with this structure, a release layer 32 having a thickness of about 1000 A (can be as little as 20 A) is grown on a GaAs:Cr substrate 31. A 500 A thick GaAs epitaxial layer 33 is formed over the release layer 32 followed by epitaxial layers 34, 35 and 36 consisting of $Al_xGa_{1-x}As$ (5,000 A), GaAs (2 $\mu$m), and $Al_xGa_{1-x}As$ (5,000 A)m respectively wherein $x \leq 0.4$. A support layer 35, under tension, is provided over the top $Al_xGa_{1-x}As$ layer. The minority-carrier lifetime in this structure may be very long. A surface layer of $Ga_{1-x}Al_xAs$ as thin as 100 A is able to confine the minority-carriers within the GaAs layer 35 potential well. When the upper $Al_xGa_{1-x}As$ layer is etched away, the minority-carrier lifetime becomes very short due to surface recombination. Therefore, the structure permits a sensitive measure of very small etch rates.

By monitoring the minority-carrier lifetime of the GaAs potential well capped by the thin $Al_xGa_{1-x}As$ layers as a function of etch time and of composition x, we determined some of these important parametric dependences. We found that the etch rate of $Al_{0.4}Ga_{0.6}As$ in concentrated (48%) HF acid could be very slow, only $\approx 1.5$ A per hour, at room temperature and even slower at 0° C. We must assume that the etch rate of pure GaAs is yet again slower. By contrast, an increase in aluminum concentration from 40 to 50% increases the etch rate by many orders of magnitude. Based upon the speed at which the AlAs release layers are undercut, the etch rate can be as high as 1 mm per hour (depending upon and roughly proportional to HF acid concentration). Such a degree of selectivity ($\geq 10^7$) might be associated with percolation type behavior or possibly a shift from T minimum to X-point minimum in the band structure. In optimizing the lift-off process we standardized the release layer composition to pure AlAs but $Al_xGa_{1-x}As$ layers where x is $\geq 0.5$ were equally successful.

The films were grown on <100> oriented GaAs substrates by molecular beam epitaxy and organometallic chemical vapor deposition. The superb electronic quality of epitaxially grown films is unaffected by the lift-off process. This may be seen from the minority-carrier lifetime decay curves shown in FIG. 4. Minority-carrier lifetime is one of the best measures of crystalline perfection and purity. The test structure shown in FIG. 3 was monitored by a contactless lifetime probe technique as is known in the art. For comparison, the carrier density decay curve was measured before lift-off and then again after lift-off. The two decays overlay identically so there is only one curve actually shown in FIG. 4. This indicates that the peeled film did not suffer any damage or cracking with the novel process. The initial rapid decay is due to radiative electronhole recombination, and the slow decay at lower density measures the Shockley-Read-Hall lifetime.

EXAMPLE

In accordance with the novel process, a solution, e.g., 25 grams of support layer material in 100 ml solvent is sprayed onto a finished GaAs wafer having the epitaxially grown release layer and device layers thereon through a shadow mask and the solvent is evaporated. This is done several times to build up the support layer thickness. A preferred support layer material is a polymeric material known as Apiezon W which is readily soluble in trichloroethylene. This material is a mixture consisting of 62% paraffinic hydrocarbon polymer and 38% asphaltene hydrocarbons. Typically the thickness of the support layer is from 0.1 mm to 1 mm.

The support layer is then air cured for about ½ hour and the wafer is then placed in an oven at about 100° C. for about ½ hour to cure the support layer. This heating process produces the tension which causes the curvature upon etching of the release layer. The epitaxial layer edges around the support layer are then exposed by removing the support layer from around the edges with a solvent and then etching non-selectively or by cleavage. The same is then placed in HF acid solution. Typically, 10% HF acid concentrations are employed, concentrated HF being a 48% solution. The sample is allowed to sit in the HF for up to about 24 hours and the GaAs epitaxial film supported by the support layer simply floats off or is detached from the substrate. The film may then be removed and adhered to any other desired substrate.

We have also discovered that the selectivity of etching of the release layer can be enhanced if etching is accomplished at reduced temperatures, e.g. about 0° C.

While Apiezon W is a preferred support layer which when treated as stated gives the desired result, it will be obvious to those skilled in the art that the support layer may be any polymeric material, which is cured or further cured after adhering it to the surface of the film to be removed such that the bonds formed upon curing are under tension due to adhesion to the film.

It should be understood that the epitaxial film being removed may be a single layer or multiple epitaxial layers and metallized to provide means for making electrical contact thereto and forming a semiconductor device. It should be further understood that the concept described herein is not limited to any particular semiconductor material, release layer or support layer and the principles can be employed with any compatible layers wherein a release layer can be selectively etched and undercut from between a single substrate and a overlying epitaxial semiconductor layer.

The novel process described above allows one to make structures employing epitaxial films which otherwise have not been possible. For example, a free epitaxial film comprising layers forming a light emitting diode, a laser, a photodetector or a photovoltaic device 51 may be directly adhered to an optical fiber or fiber bundle 52 as depicted in FIGS. 5–7 by means of an adhesive or by an adhesiveless optical contact using Van der Waals forces as previously described. Such structures will eliminate and/or reduce the problems of optical coupling normally associated with such devices in optical systems.

A particularly suitable choice for coupling with an optical fiber or alternatively, for placement on a conductive substrate, is a peeled film having a plurality of epitaxially grown doped and/or intrinsic layers of $In_xGa_{1-x}As_yP_{1-y}$ wherein x and y can vary from 0 to 1 to produce a laser device. Such $In_xGa_{1-x}As_yP_{1-y}$ lasers are well known in the art and are generally formed by molecular beam epitaxial growth of the layers on an InP substrate. Here, a thin (20A–100A) strained AlAs release layer is employed between the substrate and the active device layers and the film is peeled in accordance with the teachings of the present invention.

What is claimed is:

1. A process for selectively freeing an epitaxial film from a single crystal substrate upon which it was grown and comprising the steps of selectively etching away a thin release layer positioned between said film and said substrate and causing edges of said film to curl upwardly as said release layer is etched away to enhance the outdiffusion of reaction products of the etching process from the active etching area.

2. The process entitled in claim 1 wherein said release layer is $\leq 1000$ A thick.

3. The process recited in claim 1 wherein said release layer is between 20 A and 100 A thick.

4. The process recited in claim 1 wherein said edges are caused to curl by applying over said film a support layer which is caused to be under tension.

5. The process recited in claim 4 wherein said support layer is a polymeric material and wherein tension is induced therein after adhesion to the surface of said film.

6. The process recited in claim 5 wherein said support layer is a mixture comprising a paraffinic hydrocarbon polymer and asphaltene hydrocarbons, said process comprising the steps of applying said mixture to the surface of said film to a thickness of from 0.1 mm to 1 mm, and heating said film to cause the film to be under tension.

7. The process recited in claim 1 wherein said film comprises an electronic, optical or electro-optical device.

8. The process recited in claim 7 further including the step of adhering said film to a second substrate.

9. The process recited in claim 8 wherein said film is adhered to said second substrate by means of an adhesive.

10. The process recited in claim 8 wherein said film is adhered to said substrate without any adhesive by means of Van der Waals forces.

11. The process recited in claim 7 wherein said film comprises layers of $Al_xGa_{1-x}As$ wherein x is from 0.0 to 0.4.

12. The process recited in claim 7 wherein said film comprises layers in the $InP-In_xGa_{1-x}As_yP_{1-y}$ system and wherein said release layer is AlAs, wherein x and y have respective values within the range of zero to one.

13. The process recited in claim 8 wherein said second substrate is an optical fiber and said device film has an optical input or an optical output which when mounted on said fiber is optically coupled thereto.

14. The process recited in claim 11 wherein etching is performed with HF at lower than room temperature.

15. The process recited in claim 14 wherein etching is performed at about 0° C.

16. The process recited in claim 12 wherein etching is performed with HF at lower than room temperature.

17. The process recited in claim 16 wherein etching is performed at about 0°C.

* * * * *

UNITED STATES PATENT AND TRADEMARK OFFICE
CERTIFICATE OF CORRECTION

PATENT NO. : 4,846,931

DATED : July 11, 1989

INVENTOR(S) : Thomas J. Gmitter and Eli Yablonovitch

It is certified that error appears in the above-identified patent and that said Letters Patent is hereby corrected as shown below:

Column 1, line 58, change "supper" to --support--;
         line 59, delete "the".
Column 2, lines 1 and 2, change "$Ga_{0.3}Al_{0}.7As$" to --$Ga_{0.3}Al_{0.7}As$--;
         line 27, after "it" insert --was--.
Column 3, line 21, change "hydroflouric" to --hydrofluoric--.
Column 4, line 29, delete ")";
         line 42, change "of" to --or--;
         line 62, change "(5,000 A)m" to --(5,000 A)--;
         lines 64 and 65, change "$Al_xGa_{1-s}As$" to --$Al_xGa_{1-x}As$--.
Column 5, lines 8 and 9, change "$Al_{0.4}Ga_06As$" to --$Al_{0.4}Ga_{0.6}As$--.

Signed and Sealed this

Twenty-second Day of May, 1990

Attest:

HARRY F. MANBECK, JR.

*Attesting Officer*        *Commissioner of Patents and Trademarks*